(12) United States Patent
Toh et al.

(10) Patent No.: US 9,922,868 B2
(45) Date of Patent: Mar. 20, 2018

(54) INTEGRATED CIRCUITS USING SILICON ON INSULATOR SUBSTRATES AND METHODS OF MANUFACTURING THE SAME

(71) Applicant: GLOBALFOUNDRIES Singapore Pte. Ltd., Singapore (SG)

(72) Inventors: Rui Tze Toh, Singapore (SG); Guan Huei See, Singapore (SG); Shaoqiang Zhang, Singapore (SG); Raj Verma Purakh, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 130 days.

(21) Appl. No.: 14/662,427

(22) Filed: Mar. 19, 2015

(65) Prior Publication Data

US 2016/0276210 A1    Sep. 22, 2016

(51) Int. Cl.
*H01L 27/12* (2006.01)
*H01L 21/762* (2006.01)
*H01L 21/84* (2006.01)

(52) U.S. Cl.
CPC .. *H01L 21/76283* (2013.01); *H01L 21/76205* (2013.01); *H01L 21/76229* (2013.01); *H01L 21/84* (2013.01); *H01L 21/845* (2013.01); *H01L 27/1203* (2013.01); *H01L 27/1211* (2013.01)

(58) Field of Classification Search
CPC ......... H01L 21/76283; H01L 21/28017; H01L 21/76205; H01L 21/76229; H01L 21/84; H01L 21/845; H01L 27/1203; H01L 27/1211; H01L 29/786–29/78696
See application file for complete search history.

(56) References Cited

U.S. PATENT DOCUMENTS

| 5,382,541 | A  | * | 1/1995  | Bajor     | H01L 21/76224 257/E21.546 |
|-----------|----|---|---------|-----------|---------------------------|
| 7,190,050 | B2 | * | 3/2007  | King      | H01L 21/84 257/401        |
| 7,298,009 | B2 | * | 11/2007 | Yan       | H01L 21/76232 257/255     |
| 7,612,405 | B2 | * | 11/2009 | Yu        | H01L 21/823431 257/328    |
| 7,692,243 | B2 | * | 4/2010  | Iwamatsu  | H01L 21/845 257/347       |

(Continued)

*Primary Examiner* — Joseph C Nicely
*Assistant Examiner* — Tuan A Hoang
(74) *Attorney, Agent, or Firm* — Lorenz & Kopf, LLP

(57) ABSTRACT

Integrated circuits and methods for manufacturing the same are provided. A method for producing an integrated circuit includes forming a deep isolation block in an SOI substrate, where the SOI substrate includes a substrate layer overlying a buried insulator that in turn overlies a carrier wafer. The deep isolation block extends through the substrate layer and contacts the buried insulator. A shallow isolation block is formed in the substrate layer, where the shallow isolation block overlies a portion of the substrate layer. An isolation mask is formed overlying at least a portion of the deep isolation block to form a masked isolation block and an exposed isolation block, where the exposed isolation block includes the shallow isolation block. The exposed isolation block is removed such that a trough is defined in the substrate layer where the shallow isolation block was removed, and a gate is formed within the trough.

12 Claims, 8 Drawing Sheets

(56) References Cited

U.S. PATENT DOCUMENTS

| | | | | |
|---|---|---|---|---|
| 8,294,180 B2 * | 10/2012 | Doyle | ............. | H01L 21/823807 257/192 |
| 8,524,546 B2 * | 9/2013 | Anderson | ....... | H01L 21/823431 257/350 |
| 8,853,015 B1 * | 10/2014 | Kuo | .................. | H01L 21/76224 257/347 |
| 2012/0040528 A1 * | 2/2012 | Kim | .................. | H01L 21/76816 438/675 |

* cited by examiner

US 9,922,868 B2

INTEGRATED CIRCUITS USING SILICON ON INSULATOR SUBSTRATES AND METHODS OF MANUFACTURING THE SAME

TECHNICAL FIELD

The technical field generally relates to integrated circuits using silicon on insulator substrates and methods for manufacturing the same, and more particularly relates to integrated circuits with deep isolation blocks and methods of manufacturing such integrated circuits.

BACKGROUND

The majority of present day integrated circuits are implemented by using a plurality of interconnected field effect transistors (FETs), also sometimes referred to as metal oxide semiconductor field effect transistors (MOSFETs or MOS transistors). A FET includes a gate electrode as a control electrode overlying a semiconductor substrate and spaced-apart source and drain regions in the substrate between which a current can flow. A gate insulator is disposed between the gate electrode and the semiconductor substrate to electrically isolate the gate electrode from the substrate. A control voltage applied to the gate electrode controls the flow of current through a channel in the substrate underlying the gate electrode between the source and drain regions. The FETs are generally "N" or "P" type FETs, ("nFET" or "pFET") where the source and drain for nFETs are implanted with "N" type conductivity-determining ions, and the source and drain for pFETs are implanted with "P" type conductivity determining ions.

Many radio frequency switches or power amplification applications require FETs with special performance criteria. A silicon on insulator (SOI) substrate is often used, where the substrate includes a buried insulating layer that aids in electrically isolating different electronic components. An SOI substrate can be used to manufacture a fully depleted FET, where the substrate underlying the gate is so thin that it becomes fully depleted of mobile charges, so there is no floating body effect. However, a partially depleted FET is desirable in some instances. For example, a partially depleted FET can improve linearity and power handling capability, especially if a control voltage is applied to the substrate underlying the gate. Three dimensional FETs are also desirable for certain applications. Three dimensional FETs may have increased gate control of the transistor channel, lower resistance in the "on" mode, reduced capacitance in the "off" mode, reduced current leakage, and reduced short channel effects, which can allow improved power handling capability. In general, each type of FET has certain strengths and weakness. An integrated circuit generally includes several different electrical operations or functions. Therefore, a mixture of different types of FETs can produce an integrated circuit with improved properties, because different strengths or weaknesses of different types of FETs are better suited to different electrical functions. However, the manufacturing processes for the different types of FETs are different, so integrated circuits generally do not include a wide variety of different types of FETs. Integrated circuits with more than one type of FET are generally more expensive to manufacture.

Accordingly, it is desirable to provide integrated circuits and methods of manufacturing integrated circuits with different types of FETs. In addition, it is desirable to provide integrated circuits and methods of forming them with on SOI substrates where limited manufacturing steps are utilized to provide a variety of different types of FETs. Furthermore, other desirable features and characteristics of the present embodiment will become apparent from the subsequent detailed description and the appended claims, taken in conjunction with the accompanying drawings and this background of the invention.

BRIEF SUMMARY

Integrated circuits and methods for manufacturing the same are provided. In an exemplary embodiment, a method for manufacturing an integrated circuit includes forming a deep isolation block in an SOI substrate, where the SOI substrate includes a substrate layer overlying a buried insulator that in turn overlies a carrier wafer. The deep isolation block extends through the substrate layer and contacts the buried insulator. A shallow isolation block is formed in the substrate layer, where the shallow isolation block overlies a portion of the substrate layer. An isolation mask is formed overlying at least a portion of the deep isolation block to form a masked isolation block and an exposed isolation block, where the exposed isolation block includes the shallow isolation block. The exposed isolation block is removed such that a trough is defined in the substrate layer where the shallow isolation block was removed, and a gate is formed within the trough.

A method for manufacturing an integrated circuit is provided in another embodiment. A deep isolation block is formed in an SOI substrate, where the SOI substrate includes a substrate layer overlying a buried insulator that in turn overlies a carrier wafer. The deep isolation block extends through the substrate layer and contacts the buried insulator. An isolation mask is formed overlying a portion of the deep isolation block to form a masked isolation block underlying the isolation mask and an exposed isolation block. The exposed isolation block is removed to form a substrate island fin overlying the buried insulator, where a gap is defined between the deep isolation block and the substrate island fin. A gate is formed overlying the substrate island fin.

An integrated circuit is provided in yet another embodiment. An SOI substrate includes a substrate layer overlying a buried insulator that in turn overlies a carrier wafer. A partially depleted field effect transistor including a gate overlying the substrate layer. The substrate layer has a first height underlying the gate of the partially depleted field effect transistor. A fully depleted field effect transistor also including a gate overlying the substrate layer. The substrate layer has a second height underlying the gate of the fully depleted field effect transistor, and the second height is less than the first height.

BRIEF DESCRIPTION OF THE DRAWINGS

The present embodiments will hereinafter be described in conjunction with the following drawing figures, wherein like numerals denote like elements, and wherein:

FIG. 12 is a perspective sectioned view of an exemplary embodiment of a portion of an integrated circuit; and wherein FIG. 13 is a side sectioned view along plane 13-13 of FIG. 11; and FIG. 15. is another side sectioned view along plane 15-15 of FIG. 11.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description.

According to various embodiments described herein, isolation blocks are formed in a substrate layer of a silicon on insulator substrate. The isolation blocks may include deep isolation blocks that extend through the substrate layer to a buried insulator, and/or shallow isolation blocks that overlie a portion of the substrate layer and the underlying buried insulator. Selected portions of the isolation blocks are removed to form various shapes, such as silicon islands, substrate layers of varying height, and/or fins with various proportions. These various shapes are then implemented into field effect transistors or other electronic components.

Embodiments of the present disclosure are generally directed to integrated circuits and methods for fabricating the same. For the sake of brevity, conventional techniques related to integrated circuit device fabrication may not be described in detail herein. Moreover, the various tasks and process steps described herein may be incorporated into a more comprehensive procedure or process having additional steps or functionality not described in detail herein. In particular, various steps in the manufacture of semiconductor-based transistors are well-known and so, in the interest of brevity, many conventional steps will only be mentioned briefly herein or will be omitted entirely without providing the well-known process details.

Figure 1:
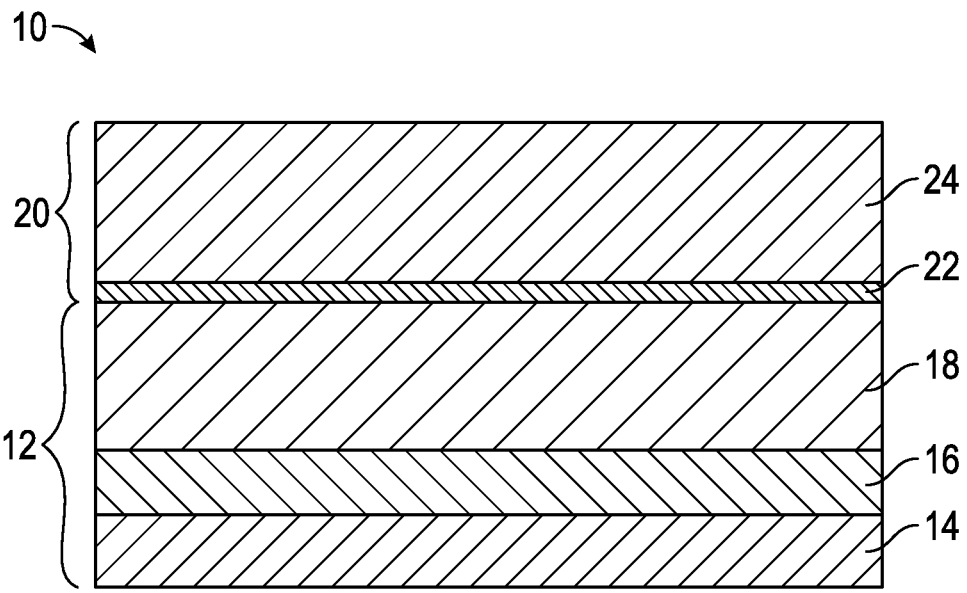
FIGS. 1-10 and 13-17 are side sectioned views illustrating portions of an integrated circuit and methods for its fabrication in accordance with exemplary embodiments.

An exemplary embodiment of an integrated circuit 10 is illustrated in FIG. 1. The integrated circuit 10 includes a silicon on insulator substrate (SOI substrate) 12, where the SOI substrate 12 includes a carrier wafer 14, a buried insulator 16 overlying the carrier wafer 14, and a substrate layer 18 overlying the buried insulator 16. As used herein, the term "overlying" means "over" such that an intervening layer may lie between the substrate layer 18 and the buried insulator 16, and "on" such the substrate layer 18 physically contacts the buried insulator 16. As used herein, the term "substrate" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. Semiconductor material also includes other materials such as relatively pure and impurity-doped germanium, gallium arsenide, zinc oxide, glass, and the like. In an exemplary embodiment, the substrate layer 18 is a monocrystalline silicon material, but other substrate materials may be used in alternate embodiments. The buried insulator 16 is silicon dioxide in an exemplary embodiment, but sapphire or other insulating materials may also be used. A conductive material generally has a resistivity of about $1 \times 10^{-4}$ ohm meters or less, and an insulating material generally has a resistivity of about $1 \times 10^4$ ohm meters or more. The carrier wafer 14 provides mechanical strength and stability to the SOI substrate 12, and is monocrystalline silicon in an exemplary embodiment. In some embodiments, the carrier wafer 14 may also provide improved isolation performance when operating in the radio frequency regime. For example, the carrier wafer 14 may include high resistivity silicon or other high resistivity materials. However, a wide variety of other materials that provide mechanical strength and stability may be used in alternate embodiments. In an exemplary embodiment, the substrate layer 18 is about 1,500 angstroms thick, the buried insulator 16 is about 4,000 angstroms thick, and the carrier wafer 14 is about 725 micrometers thick, but other dimensions are also possible. The illustrations mis-represent the proportions of these layers to emphasis details in other areas.

A hard mask 20 is formed overlying the substrate layer 18 in an exemplary embodiment, where the hard mask 20 includes a buffer layer 22 and a etch mask 24. The buffer layer 22 may be silicon dioxide, which can be deposited by chemical vapor deposition using silane and oxygen. The etch mask 24 may be silicon nitride, which can be deposited by low pressure chemical vapor deposition using ammonia and dichlorosilane. In an exemplary embodiment, the buffer layer 22 is about 100 angstroms thick, and the etch mask 24 is about 1,000 angstroms thick, but other thicknesses and other materials are also possible. The etch mask 24 may serve as a hard mask, and the buffer layer 22 may protect underlying layers from hot phosphoric acid during removal of the etch mask 24 (in embodiments where the etch mask 24 includes silicon nitride that is removed with a wet etch using hot phosphoric acid.)

Figure 2:
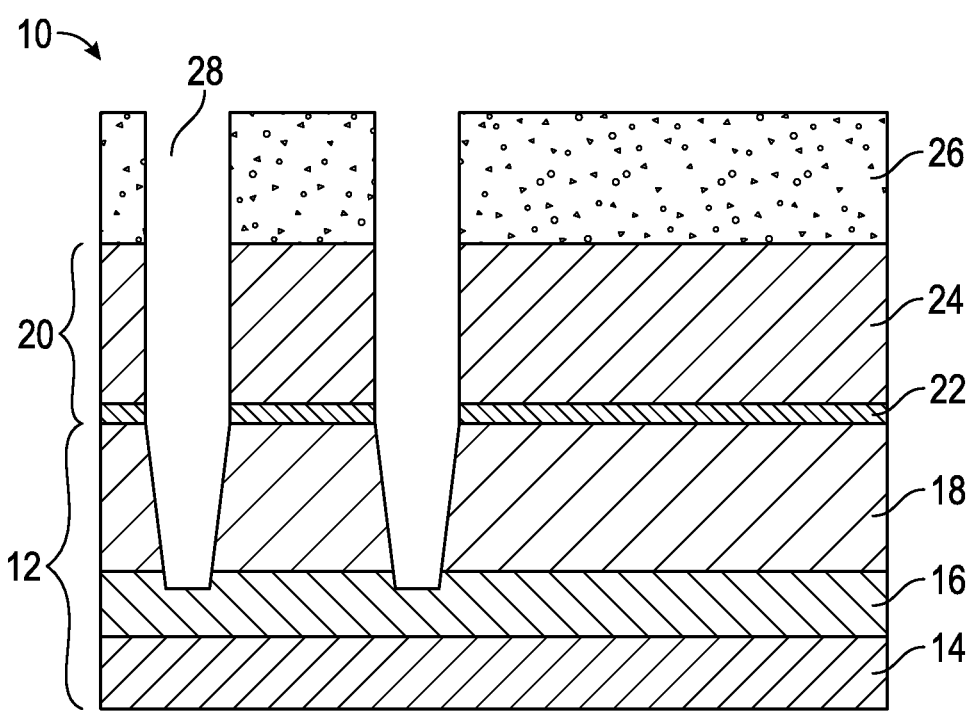

Referring to the exemplary embodiment in FIG. 2, a first photoresist layer 26 is formed overlying the hard mask 20, and the first photoresist layer 26 is patterned to expose the hard mask 20 at desired locations. The first photoresist layer 26 may be deposited by spin coating, patterned by exposure to light or other electromagnetic radiation, and the desired locations are removed with an organic solvent. A deep isolation trench 28 is then formed through the first photoresist layer 26, the hard mask 20, and the substrate layer 18, so the deep isolation trench 28 extends to the buried insulator 16. The deep isolation trench 28 is formed with an anisotropic reactive ion etch, and the etchant can be changed for the material being etched. For example, silicon nitride in the etch mask 24 may be etched with trifluoronitride, silicon oxide in the buffer layer 22 may be removed with a wet etch using hydrofluoric acid, and silicon in the substrate layer 18 may be etched with trifluoromethane. A wide variety of alternate etchants are available, as understood by those skilled in the art. The deep isolation trench 28 may extend into the buried insulator 16 in some embodiments, or the deep isolation trench 28 may terminate at a top surface of the buried insulator 16, but the deep isolation trench 28 does not typically penetrate or extend through the buried insulator 16. The first photoresist layer 26 is removed after use, such as with an oxygen containing plasma, followed by a wet clean to remove any residues.

Figure 3:
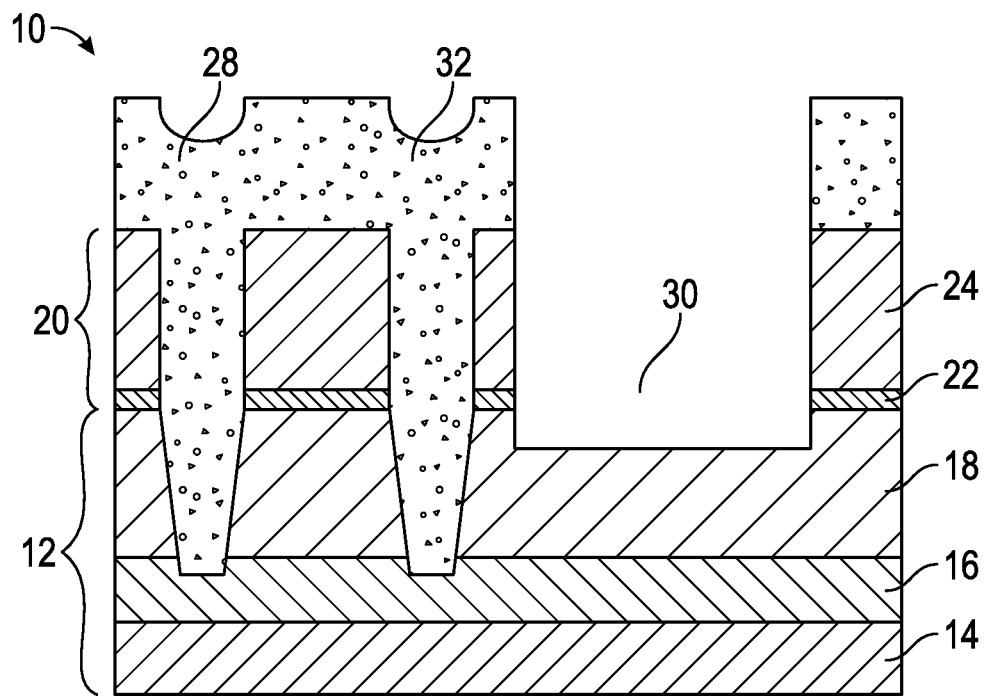
Figure 4:
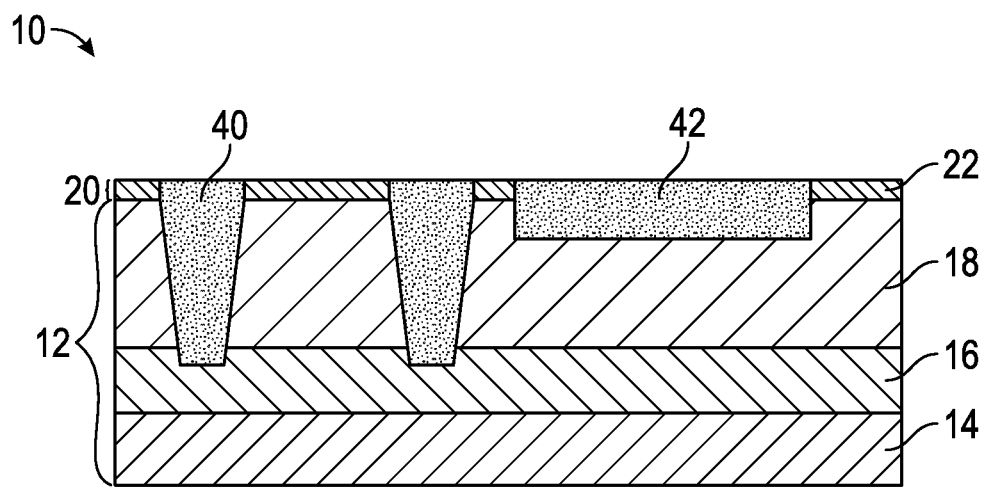

In an exemplary embodiment illustrated in FIGS. 3 and 4, a shallow isolation trench 30 is formed through the hard mask 20, where a second photoresist layer 32 is formed and patterned to expose the hard mask 20 at desired locations. The second photoresist layer 32 fills the deep isolation trench 28 in embodiments where the deep isolation trench is formed before the second photoresist layer 32 is formed, as illustrated. The shallow isolation trench 30 extends through the hard mask 20, and extends into the substrate layer 18 but does not penetrate or extend through the substrate layer 18, as seen in FIG. 3. The second photoresist layer 32 is removed after use, such as with an oxygen containing plasma. The deep isolation trench 28 and the shallow isolation trench 30 may then be filled at the same time with an insulating material, such as silicon dioxide, as illustrated in FIG. 4 with continuing reference to FIG. 3. The insulating material formed in the deep isolation trench 28 produces a deep isolation block 40 that extends through the substrate layer 18 and contacts the buried insulator 16. The insulating material formed in the shallow isolation trench 30 forms a shallow isolation block 42 that extends into the substrate layer 18, but does not penetrate the substrate layer 18 such that the shallow isolation block 42 overlies a portion of the substrate layer 18. The insulating material may be deposited in the deep and shallow isolation trenches 28, 30 by chemical vapor deposition, as described above. The hard mask 20, specifically the entire etch mask 24 and part of the buffer layer 20, can be removed, such as with a wet etch using phosphoric acid. The buffer layer 22 can protect the underlying material from the hot phosphoric acid, as mentioned above. This produces the SOI substrate 12 with one or more deep isolation blocks 40 and one or more shallow isolation blocks 42. In an alternate embodiment (not illustrated), the shallow isolation trench 30 could be formed before the deep isolation trench 28, so the second photoresist layer 32 and the first photoresist layer 26 are formed in separate steps at separate times.

Figure 5:
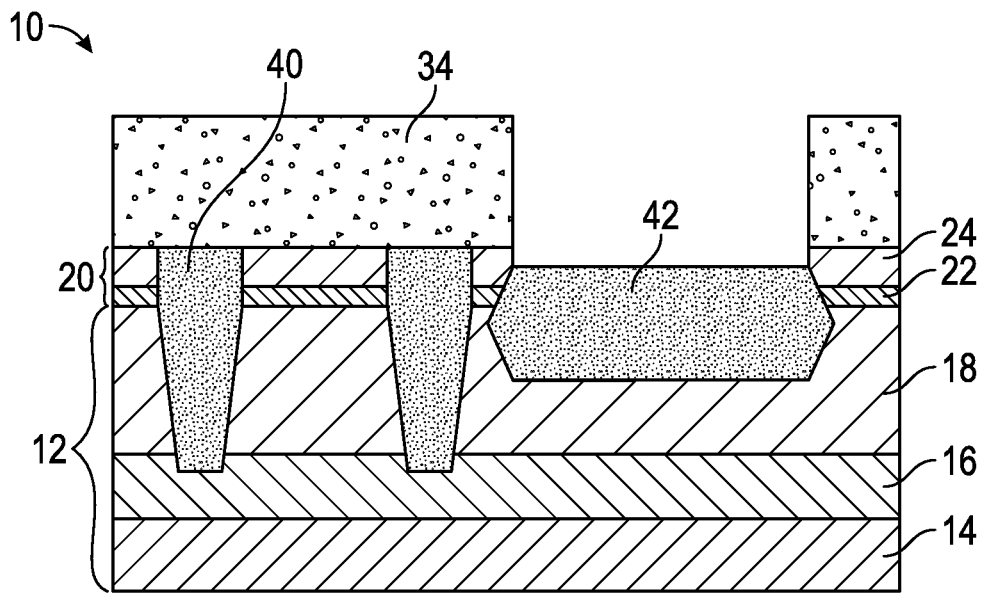

An alternate method of forming the deep and shallow isolation blocks 40, 42 is illustrated in FIG. 5, with continuing reference to FIG. 2. The deep isolation trench 28 is filled with the insulating material to form the deep isolation block 40 before forming the shallow isolation block 42. No shallow isolation trench 30 (as illustrated in FIG. 3) is formed in the substrate layer 18 in this alternate embodiment. A LOCOS (LOCal Oxidation of Silicon) mask 34 is formed overlying the substrate layer 18 and the hard mask 20, and the LOCOS mask 34 is patterned to expose areas where the shallow isolation block 42 will be formed. The LOCOS mask 34 is photoresist in an exemplary embodiment. The hard mask 20 may then be etched to transfer the pattern from the LOCOS mask 34 to the hard mask 20. The remaining LOCOS mask 34 may then be removed, such as with an oxygen containing plasma followed by a wet clean. A top portion of the substrate layer 18 that is not covered by the hard mask 20 is then oxidized to form the shallow isolation block 42, such as by exposing the substrate layer 18 to an oxidizing ambient at elevated temperatures. An oxidizing ambient can be formed with oxygen, water vapor and oxygen, and various nitrogen-oxygen compounds. Hydrochloric acid may be included in the oxidizing ambient at low concentrations. Elevated temperatures from about 700 degrees centigrade (° C.) to about 1,300° C. are effective. FIG. 5 shows the LOCOS mask 34 and the shallow isolation block 42 together for illustration purposes, but it should be understood that the LOCOS mask 34 may be removed before the shallow isolation block 42 is formed. The shallow isolation block 42 can be formed from the material of the substrate layer 18 in this manner, where the substrate layer 18 is monocrystalline silicon and the material of the shallow isolation block 42 is silicon dioxide. Any remaining hard mask 20 can be removed, such as with a wet etch using hot phosphoric acid, as described above. The shallow isolation block 42 may be formed before the deep isolation block 40 in an alternate embodiment (not illustrated), so the first photoresist layer 26 and the LOCOS mask 34 are formed in separate steps at separate times.

A wide variety of field effect transistors (FETs) can be produced by various process steps once the deep and shallow isolation blocks 40, 42 are formed. Several different embodiments are described below, where the deep and shallow isolation blocks 40, 42 are formed as described above. Various combinations of the different embodiments described above and below are also possible, so the integrated circuit 10 may include essentially any combination of the types of FETs described below.

Figure 6:
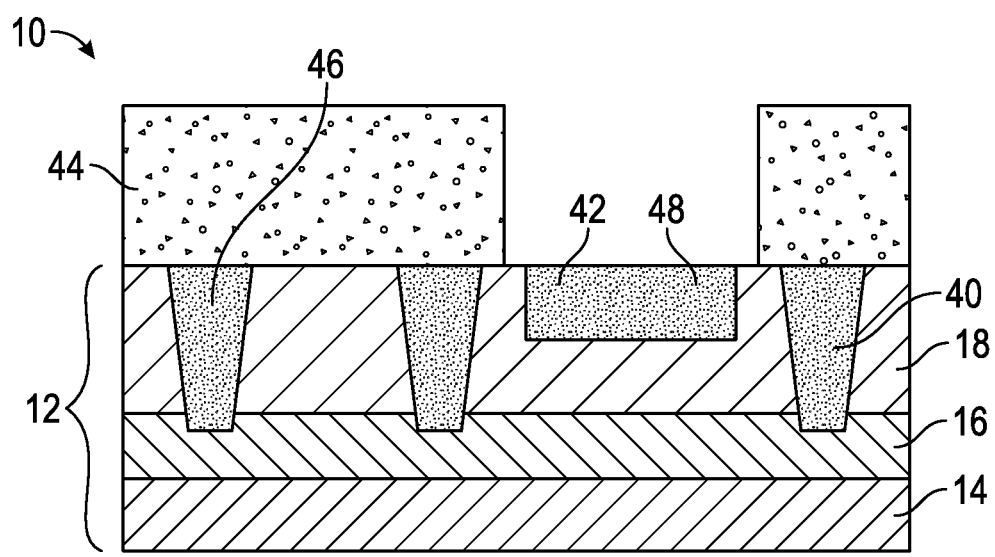

Referring to FIG. 6 with continuing reference to FIG. 4, an isolation mask 44 is formed overlying the substrate layer 18. The isolation mask 44 is photoresist in an exemplary embodiment, but the isolation mask 44 may include silicon nitride, silicon oxide, or other materials that form a more durable mask in some embodiments. The isolation mask 44 is patterned to expose a desired location, such as a shallow isolation block 42. As such, the isolation mask 44 produces a masked isolation block 46 and an exposed isolation block 48, where the masked isolation block 46 includes the deep and/or shallow isolation blocks 40, 42 that underlie the isolation mask 44, and the exposed isolation block 48 includes the deep and/or shallow isolation blocks 40, 42 that do not underlie the isolation mask 44. In the embodiment illustrated in FIG. 6, the shallow isolation block 42 is the exposed isolation block 48, and the deep isolation blocks 40 are the masked isolation block 46, but other embodiments are possible and are described below. In some embodiments, a deep and/or shallow isolation block 40, 42 may be partially masked, so a single isolation block may be a masked and an exposed isolation block 46, 48. The exposed isolation block 48 is then removed, such as with an etchant selective to the material of the exposed isolation block 48. For example, a wet etch with dilute hydrofluoric acid will remove silicon dioxide, but does not appreciably etch monocrystalline silicon or silicon nitride. The isolation mask 44 can then be removed, such as with an oxygen containing plasma. A trough 78 is formed in the substrate layer 18 where the shallow isolation block 42 is removed, where the trough 78 is filled in FIG. 7, so a portion of the substrate layer 18 underlies the trough 78.

FETs are formed after the exposed isolation block 48 is removed. In the exemplary embodiment illustrated in FIG. 7, a gate dielectric 50 is formed overlying the substrate layer 18. In an exemplary embodiment, the gate dielectric 50 is formed by oxidizing a top surface of the substrate layer 18, as described above, but the gate dielectric 50 may be deposited or otherwise formed in other embodiments. A gate layer 52 is then formed overlying the gate dielectric 50, where the gate layer 52 is polysilicon in an exemplary embodiment. Polysilicon for the gate layer 52 can be deposited by low pressure chemical vapor deposition using a silane ambient. A gate mask 54 is then formed overlying the gate layer 52, where the gate mask 54 includes photoresist in an exemplary embodiment. The gate mask 54 may include other materials in some embodiments, as understood by those skilled in the art. The gate mask 54 is patterned to cover the areas where a gate will be formed.

Figure 7:
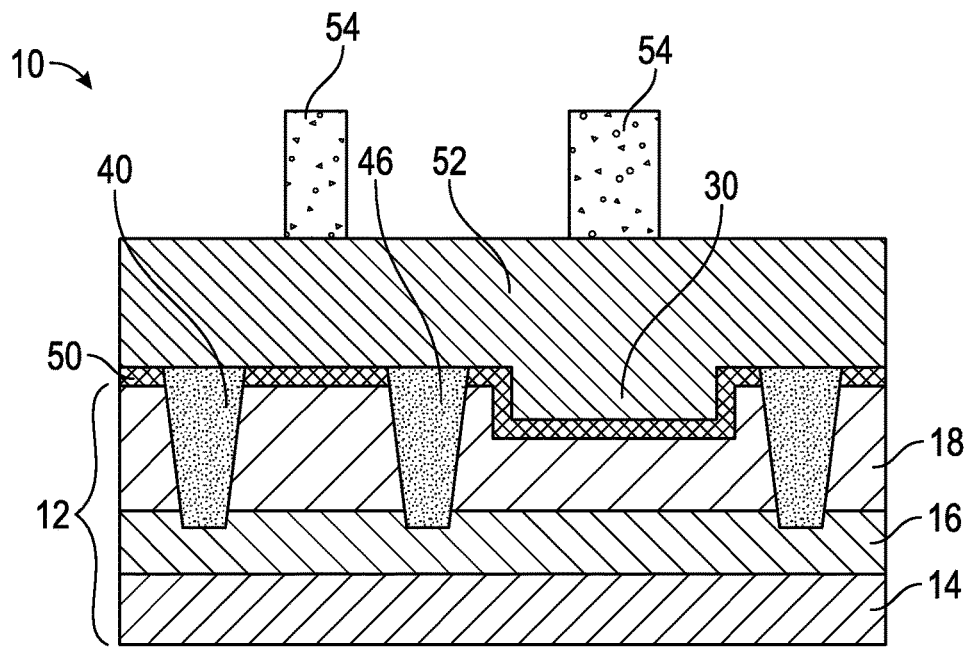
Figure 8:
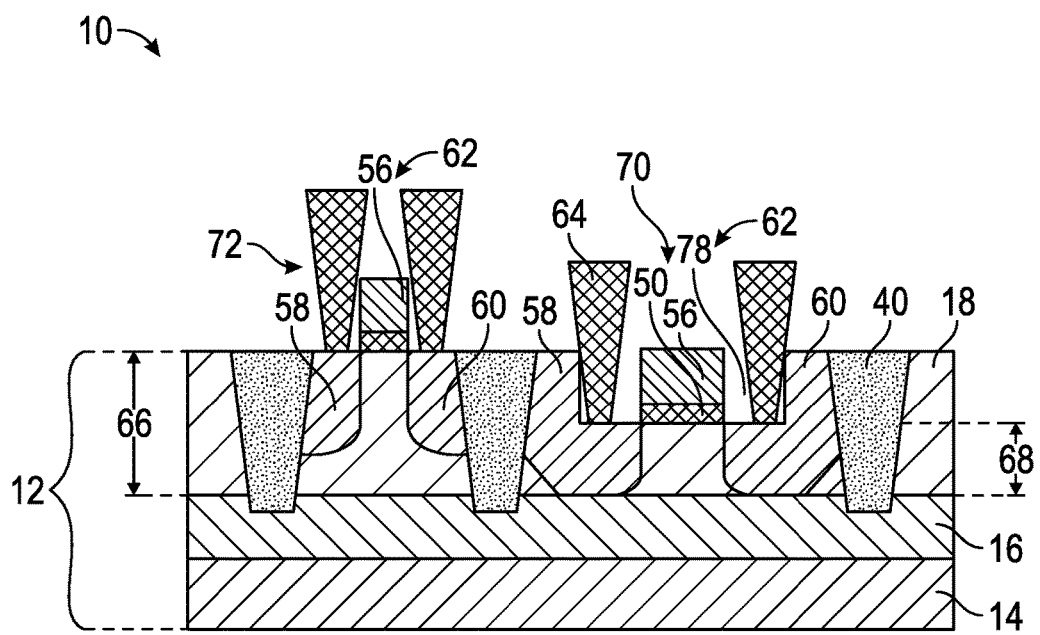

Referring to FIG. 8, with continuing reference to FIG. 7, the gate layer 52 is removed except for where it is covered by the patterned gate mask 54 to form a gate 56. The gate 56 is formed by anisotropically etching the gate layer 52 except for where the gate layer 52 underlies the gate mask 54. A reactive ion etch with hydrogen bromide can be used to remove the exposed portions of the gate layer 52 and thereby form the gate 56. The gate mask 54 is removed when no longer needed, such as with an oxygen containing plasma and other selective etchants for embodiments where the gate mask 54 includes materials other than photoresist. The gate dielectric 50 can then be removed except for where it is covered by the gate 56, such as with a wet etch using dilute hydrofluoric acid. A source 58 and drain 60 can then be formed in the substrate layer 18, such as by implanting and annealing of conductivity imparting ions as understood by those skilled in the art, to produce a FET 62. Contacts 64 can also be formed using processes well known to those skilled in the art. For example, the contact 64 may include an adhesion layer, a barrier layer, and a plug (not individually illustrated), which are sequentially deposited. In an exemplary embodiment, an adhesion layer of titanium is formed by low pressure chemical vapor deposition of titanium pentachloride, a barrier layer of titanium nitride is formed by chemical vapor deposition of titanium tetrabromide and ammonia, and a plug of tungsten is formed by chemical vapor deposition of tungsten hexafluoride and hydrogen. Other types of contacts are also possible, such as copper or other conductive materials.

The FETs 62 formed as described above have a first height identified by the double headed arrow labelled 66, and a second height identified by the double headed arrow labeled 68. The first height 66 is larger than the second height 68. The FET 62 at the first height 66 is formed overlying the substrate layer 18 that was not underlying a shallow isolation block 42 (as illustrated on the left side of FIG. 8.) This type of FET 62 is a partially depleted FET 70 because the depth of the substrate layer 18 underlying the partially depleted FET 70 is too large to completely deplete the mobile charges. The FET 62 at the second height 68 is formed overlying the substrate layer 18 that was underlying a shallow isolation block 42 (as illustrated on the right side of FIG. 8) and this forms a fully depleted FET 72. The depth of the substrate layer 18 underlying the fully depleted FET 72 is small enough that the substrate layer 18 can be fully depleted of mobile charges. The partially depleted FET 70 and the fully depleted FET 72 described above and illustrated in FIG. 8 are planar FETs, because the substrate layer 18 underlying the gate 56 is essentially planar for the entire area under the gate 56. In this manner, the integrated circuit 10 may be produced that includes both partially and fully depleted FETS 70, 72 that are planar and that are formed on the same integrated circuit 10. Various alternate embodiments are also possible, such as an embodiment where the top surface of the substrate layer 18 for the fully depleted FET 72 is at a constant second height 68 for the entire distance between the neighboring deep isolation blocks 40. Other possible embodiments include FETs 62 with replacement metal gates, gates 56 formed from alternate materials, and other variations understood by those skilled in the art.

Figure 9:
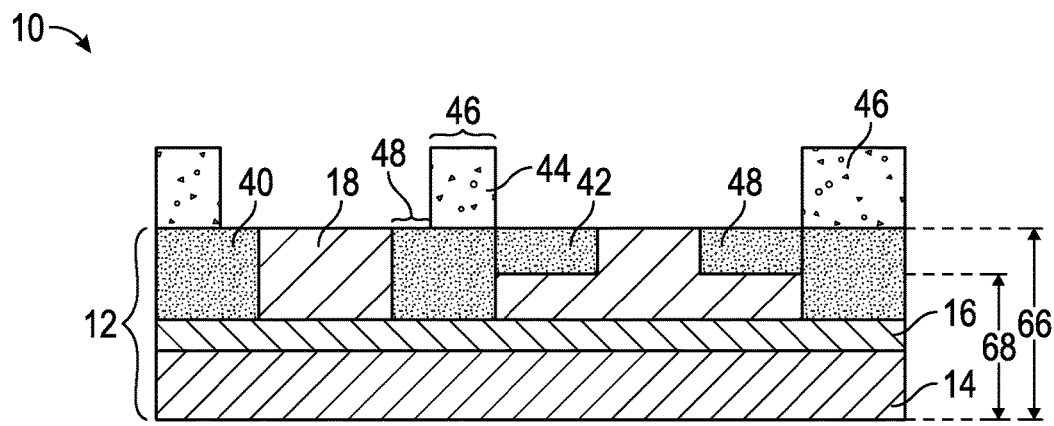
Figure 10:
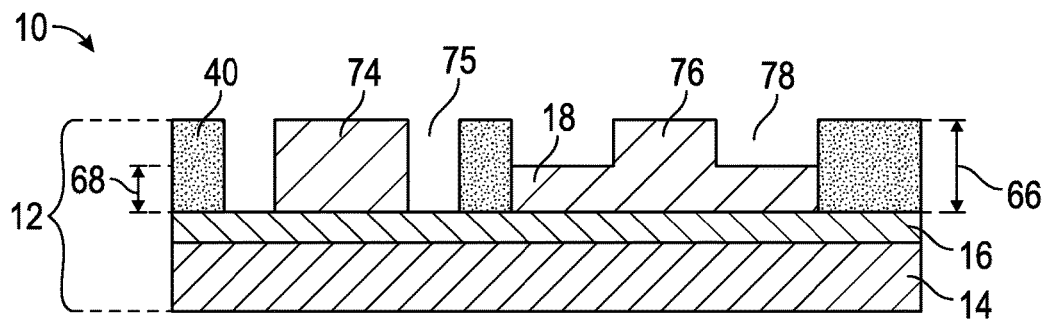

Reference is made to another embodiment illustrated in FIGS. 9 and 10, beginning with FIG. 9. On the right hand portion of FIG. 9, the integrated circuit 10 includes deep isolation blocks 40 and shallow isolation blocks 42, where the shallow isolation blocks 42 are positioned between adjacent deep isolation blocks 40 such that the shallow isolation blocks 42 do not physically contact each other. The deep isolation blocks 40 include adjacent deep isolation blocks 40, where the term "adjacent deep isolation blocks" means two deep isolation blocks 40 with a section of the substrate layer 18 between the adjacent deep isolation blocks 40, but no other deep isolation block 40 is between the adjacent deep isolation blocks 40. Zero, one, or more shallow isolation blocks 42 may be between the adjacent deep isolation blocks 40 in various embodiments, with two shallow isolation blocks 42 illustrated on the right hand side of FIG. 9. The isolation mask 44 covers the portion of the adjacent deep isolation blocks 40 that abuts the substrate layer 18 and the shallow isolation blocks 42 in the embodiment illustrated on the right side of FIG. 9, but the isolation mask 44 may leave an exposed portion of the deep isolation blocks 40 abutting opposite sides of the shallow isolation blocks 42 in alternate embodiments. The shallow isolation blocks 42 are exposed isolation blocks 48 in the illustrated embodiment. Referring to the left hand side of FIG. 9, the adjacent deep isolation blocks 40 are on opposite sides of a section of the substrate layer 18 with no shallow isolation block 42 between the adjacent deep isolation blocks 40. These adjacent deep isolation blocks 40 include a section that is an exposed isolation block 48 and another section that is a masked isolation block 46. The isolation mask 44 is formed overlying a portion of the adjacent deep isolation blocks 40 (on the left side of FIG. 9), where the exposed portion of the adjacent deep isolation blocks 40 abut the substrate layer 18 between the adjacent deep isolation blocks 40.

Referring to an exemplary embodiment of FIG. 10 with continuing reference to FIG. 9, the exposed isolation blocks 48 are removed while the masked isolation blocks 46 are not removed. The removal of the portion of the adjacent deep isolation blocks 40 that are exposed isolation blocks 48 on the left hand side of FIG. 9 forms a substrate island fin 74 between the adjacent deep isolation blocks 40. The substrate island fin 74 is freestanding on the buried insulator 16, so the substrate island fin 74 does not physically contact the adjacent deep isolation blocks 40. As such, a gap 75 is defined overlying the buried insulator 16 between each of the adjacent deep isolation blocks 40 and the substrate island fin 74. In an alternate embodiment (not illustrated), the gap 75 may be formed on only one side of the substrate island fin 74, so the substrate island fin 74 may contact one of the adjacent deep isolation blocks 40. The removal of the shallow isolation blocks 40 produces a short fin 76 between adjacent troughs 78, as seen on the right hand side of FIG. 10. The troughs 78 are located where the shallow isolation blocks 42 were previously positioned. The short fin 76 extends to the first height 66, where the first height 66 is about the same as the height of the deep isolation blocks 40. A gate 56 (not illustrated in FIGS. 9 and 10 but explained and illustrated in FIGS. 7 and 8) can then be formed overlying the substrate island fin 74, the short fin 76, and within the troughs 78 to produce FETs 62. The gate 56 overlying and adjacent to the substrate island fin 74 produces a three dimensional FET 62, where the substrate island fin 74 acts as a fin for a FinFET, (a FinFET is a field effect transistor formed overlying a fin.) The gate 56 (and associated gate dielectric 50) overlying the short fin 76 also produces a FinFET, but the fin height underlying the gate 56 varies in the two embodiments shown in FIG. 10, where the fin height is vertical length of the gate 56 adjacent to the fin. Each substrate layer 18 underlying the gate 56 for each FET 62 is at the first height 66, as described above. The manufacture of the FinFETs described above can be combined with the manufacture of the planar FETs described above, so the integrated circuit 10 can include several different FET designs.

Figure 11:
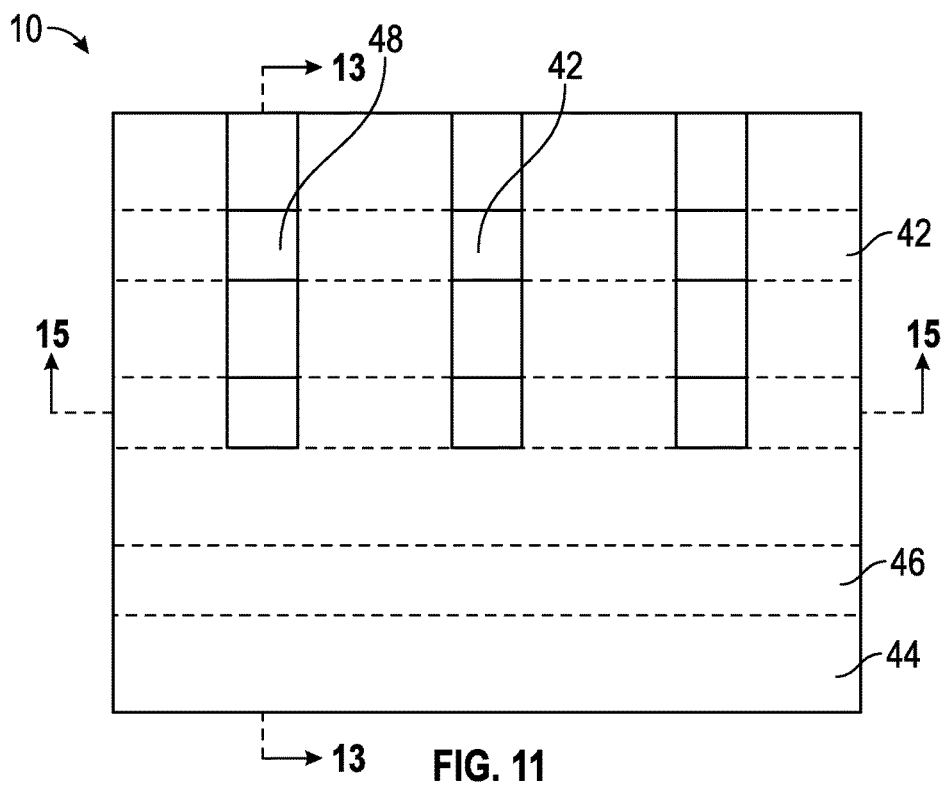
FIG. 11 is a plan view of an integrated circuit and methods for its fabrication in accordance with exemplary embodiments.
Figure 12:
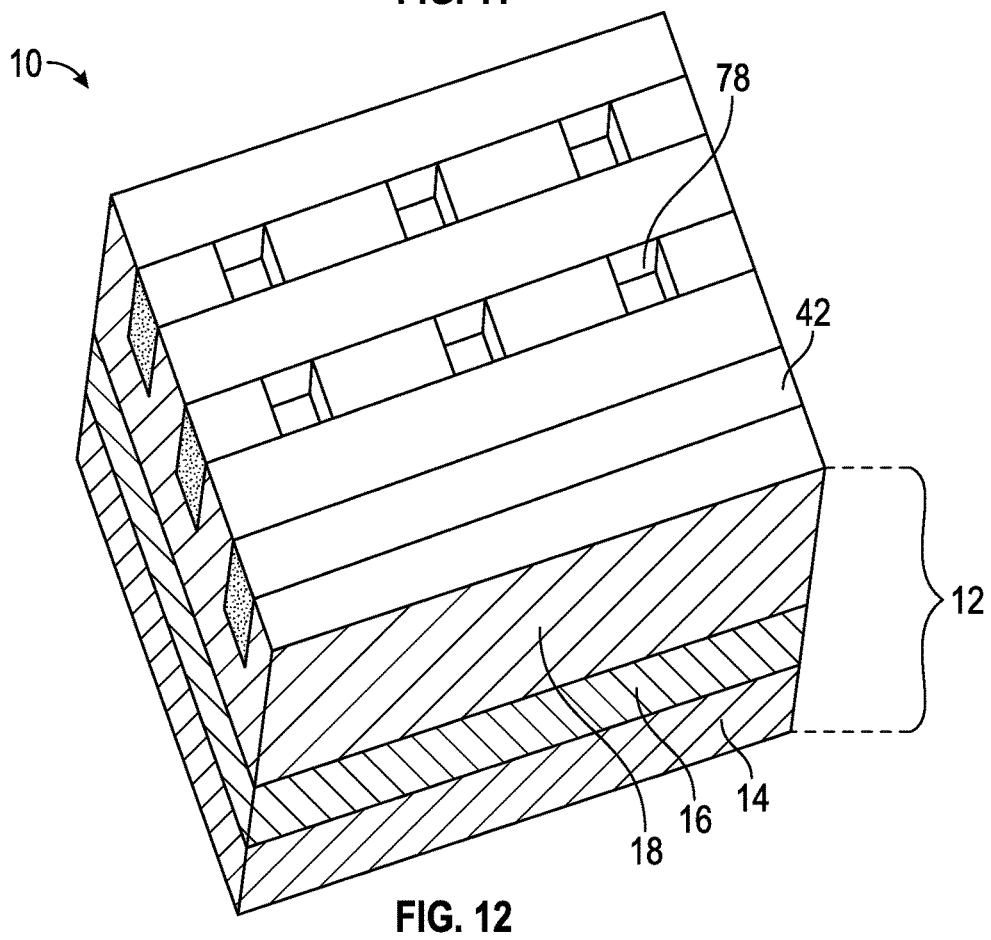
Figure 13:
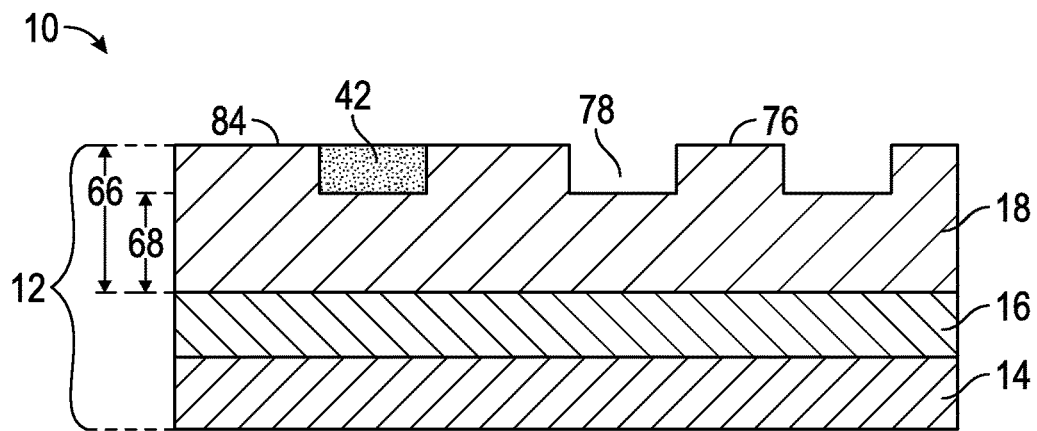

Yet another embodiment is illustrated in FIGS. 11-15. FIG. 11 is a plan view of the integrated circuit 10. An isolation mask 44 overlies the SOI substrate 12 (not visible, but underlying the illustration), where shallow isolation blocks 42 underlying the isolation mask 44 are illustrated with dotted lines. Three sections of the isolation mask 44 are removed in the illustrated embodiment, but more or fewer sections may be removed in alternate embodiments. The portions of the shallow isolation blocks 42 that are illustrated with solid lines illustrates the exposed isolation blocks 48 that do not have an overlying isolation mask 44. Referring to the sectional perspective view in FIG. 12, the integrated circuit 10 is shown after the exposed isolation blocks 48 and the isolation mask 44 have been removed. In FIG. 12, the SOI substrate 12 has three shallow isolation blocks 42 and six sections of the shallow isolation blocks 42 removed. FIG. 13 illustrates the integrated circuit 10 along plane 13-13 from FIG. 11, where FIGS. 12 and 13 are different views of the same embodiment. As can be seen, the substrate layer 18 includes troughs 78 and short fins 76.

Figure 14:
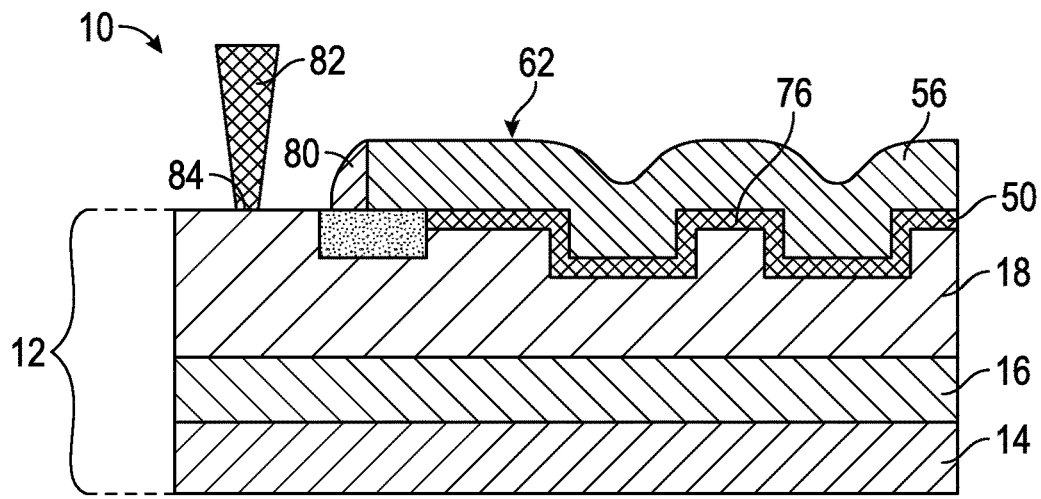
Figure 15:
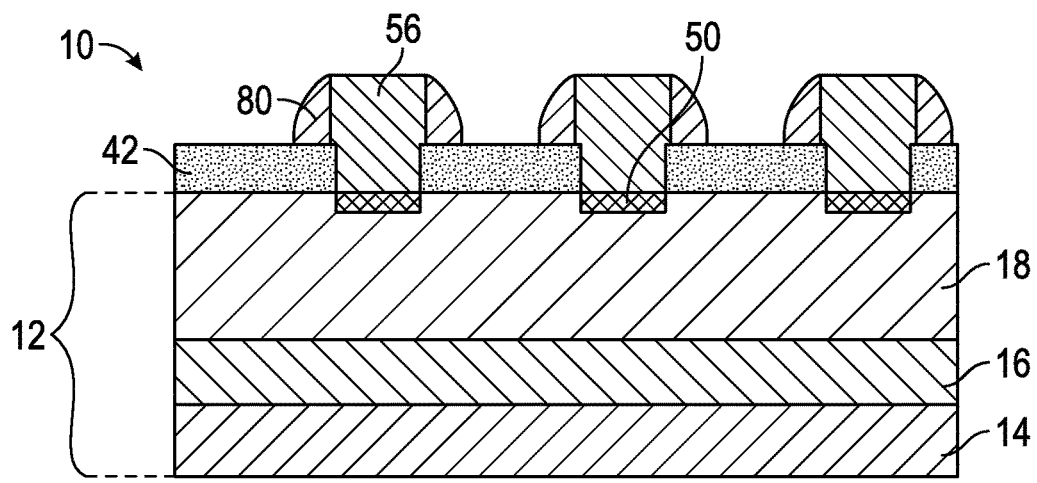

Reference is made to FIGS. 14 and 15, with continuing reference to FIGS. 11-13, where FIG. 14 illustrates an embodiment of the integrated circuit with a gate 56 along plane 13-13 from FIG. 11, and FIG. 15 illustrates an embodiment of the integrated circuit 10 with the gate 56 along plane 15-15 from FIG. 11. A gate dielectric 50 and a gate 56 are formed overlying the short fins 76 and within the troughs 78, where a spacer 80 is illustrated adjacent to one end of the gate 56. The spacer 80 may be formed using standard techniques known to those skilled in the art, and may include silicon nitride in an exemplary embodiment. A body contact 82 is formed in electrical connection with a body contact point 84 of the substrate layer 18. The body contact point 84 includes exposed silicon of the substrate layer 18 with the same type of conductivity determining ions as a channel within the substrate layer 18 underlying the gate 56. The body contact 82 may be formed by standard techniques known to those skilled in the art, and the body contact 82 may be formed and processed with the contacts 64 described above and illustrated in FIG. 8. The body contact 82 may be formed in a via that extends through an interlayer dielectric (not illustrated) overlying the SOI substrate 12. A shallow isolation block 42 is positioned between the short fin 76 and trough 78 on one side, and the body contact point 84 on the other side. The substrate layer 18 is contiguous from the body contact point 84 to an area of the substrate layer 18 that underlies the gate 56. The contiguous substrate layer 18 extends underneath the illustrated shallow isolation block 42. The body contact 82 may be used to electrically control the voltage in the channel of the substrate layer 18 underlying the gate 56. The controlled voltage in the channel improves linearity and power handling capability of the FET 62. The FET 62 with the body contact 82 can also be produced with the various FETs 62 described above, and all described embodiments may or may not be within the same integrated circuit 10.

Figure 16:
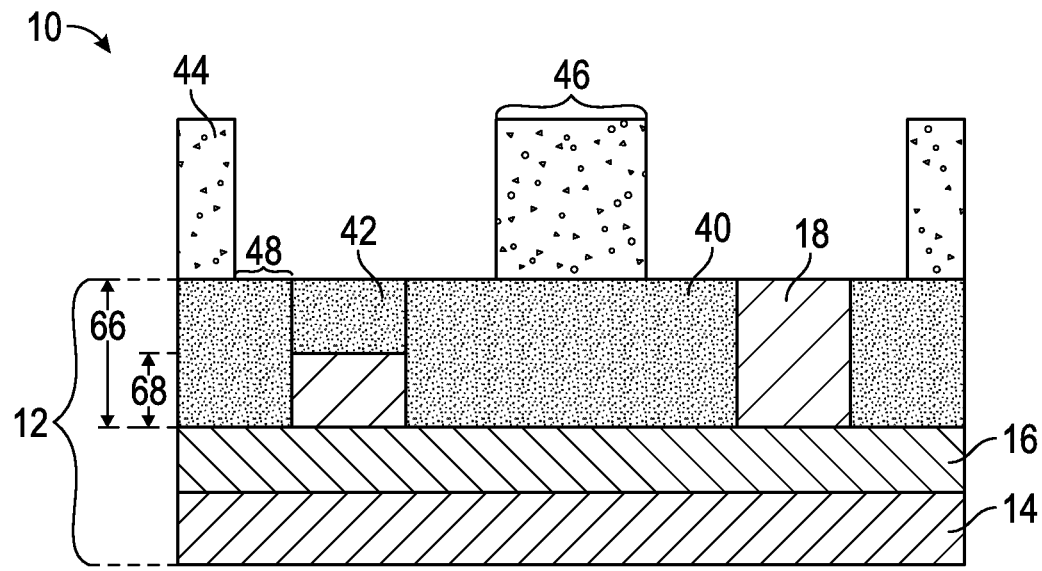
Figure 17:
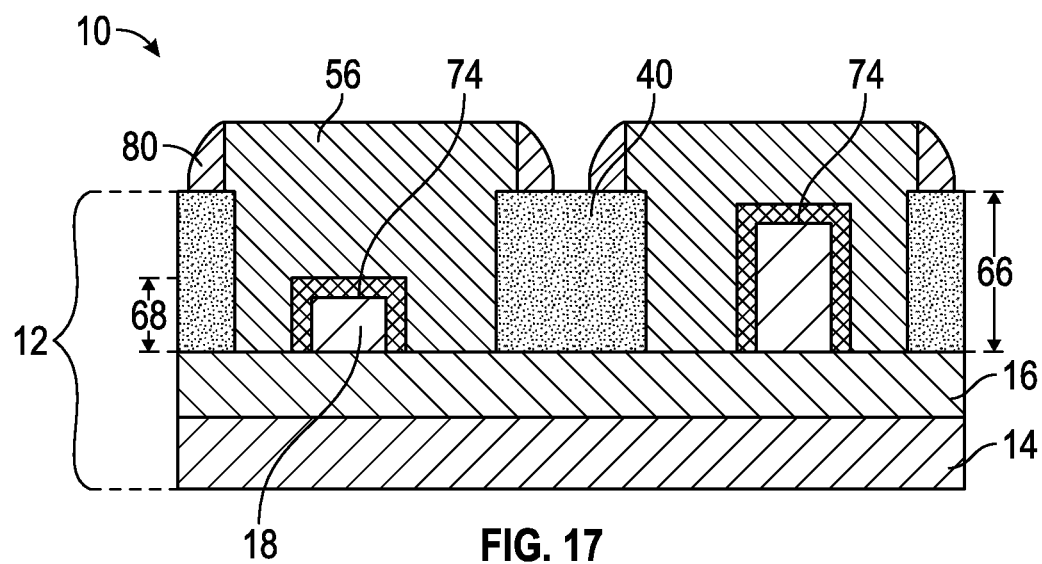

Yet another exemplary embodiment is illustrated in FIGS. 16 and 17. FIG. 16 illustrates two sets of adjacent deep isolation blocks 40, one on the left side of FIG. 16 and one on the right side of FIG. 16, where the center deep isolation block 40 forms part of each set of adjacent deep isolation blocks 40. A shallow isolation block 42 fills the space between the adjacent deep isolation blocks 40 on the left of FIG. 16, and the substrate layer 18 fills the space between the adjacent deep isolation blocks 40 on the right of FIG. 16. The isolation mask 44 covers a portion of both sets of adjacent deep isolation blocks 40, so each illustrated deep isolation block 40 includes a portion that is a masked isolation block 46 and another portion that is an exposed isolation block 48. The exposed isolation blocks 48 are removed, and a gate dielectric 50 and a gate 56 are formed overlying the two different illustrated substrate island fins 74 positioned between the two sets of adjacent deep isolation blocks 40, one on the left and one on the right of FIGS. 16 and 17. Optional spacers 80 are also formed in the illustrated embodiment. The substrate layer 18 of the FET 62 formed using the substrate island fin 74 that included a shallow isolation block 42 is at the second height 68, and the substrate layer 18 of the FET 62 formed using the substrate island fin 74 without a shallow isolation block 42 is at a first height 66 that is greater than the second height 68. As such, FinFETs of different heights can be manufactured on the same integrated circuit 10.

Several different designs for FETs 62 have been described above, as well as manufacturing methods for the same. The different FET designs can be manufactured on the same integrated circuit 10, so a wide variety of design options are possible. Many of the same manufacturing steps are used for the different embodiments described above, so manufacturing costs are not significantly higher than for a similar integrated circuit 10 with one FET design, or an integrated circuit 10 with fewer FET designs than described above. The various FETs 62 described above can then be incorporated into the integrated circuit 10 using methods and techniques known to those skilled in the art.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. A method of manufacturing an integrated circuit comprising:
    forming a deep isolation block in an SOI substrate, wherein the SOI substrate comprises a buried insulator overlying a carrier wafer, a substrate layer overlying the buried insulator, and wherein the deep isolation block extends through the substrate layer and contacts the buried insulator;
    forming a shallow isolation block in the substrate layer, wherein the shallow isolation block overlies a portion of the substrate layer, wherein the shallow isolation block contacts the deep isolation block on a side surface of the deep isolation block;
    forming an isolation mask overlying at least a portion of the deep isolation block to form a masked isolation block and an exposed isolation block, wherein the exposed isolation block further comprises the shallow isolation block; and
    removing the exposed isolation block such that a trough is defined in the substrate layer where the shallow isolation block was removed, wherein the trough is defined overlying a portion of the substrate layer, and wherein the trough is defined directly between the deep isolation block and a short fin formed from the substrate layer.

2. The method of claim 1 wherein:
    removing the exposed isolation block such that the trough is defined in the substrate layer comprises forming a short fin between adjacent troughs; and
    forming the gate comprises forming the gate overlying the short fin and within the adjacent troughs.

3. The method of claim 1 wherein:
    forming the deep isolation block comprises forming adjacent deep isolation blocks;

forming the isolation mask comprises forming the exposed isolation block from a portion of the adjacent deep isolation blocks;

removing the exposed isolation block comprises removing the portion of the adjacent deep isolation blocks to form a substrate island fin between the adjacent deep isolation blocks, wherein a gap is defined between the substrate island fin and each of the adjacent deep isolation blocks; and forming the gate comprises forming the gate overlying the substrate island fin.

4. The method of claim 1 wherein forming the deep isolation block comprises:

forming a hard mask;

forming and patterning a first photoresist layer;

forming a deep isolation trench in the substrate layer through the hard mask and the first photoresist layer; and filling the deep isolation trench with an insulating material.

5. The method of claim 4 wherein forming the shallow isolation block comprises:

forming a second photoresist layer at a different time than forming the first photoresist layer;

forming a shallow isolation trench in the substrate layer through the second photoresist layer; and filling the shallow isolation trench and the deep isolation trench at the same time.

6. A method of manufacturing an integrated circuit comprising:

forming a deep isolation block in an SOI substrate, wherein the SOI substrate comprises a buried insulator overlying a carrier wafer, and a substrate layer overlying the buried insulator, and wherein the deep isolation block extends through the substrate layer and contact the buried insulator;

forming a shallow isolation block in direct contact with the deep isolation block on a side surface of the deep isolation block, wherein the shallow isolation block overlies the SOI substrate;

forming an isolation mask overlying a portion of the deep isolation block to form a masked isolation block underlying the isolation mask and an exposed isolation block, wherein the shallow isolation block comprises at least a portion of the exposed isolation block;

removing the exposed isolation block to form a substrate island fin overlying the buried insulator, wherein a gap is defined between the deep isolation block and the substrate island fin, and wherein a trough is defined within the SOI substrate in the location previously occupied by the shallow isolation block such that a short fin is directly adjacent to the trough and the trough is between the short fin and the deep isolation block; and forming a gate overlying the substrate island fin and overlying the short fin.

7. The method of claim 6 wherein:

forming the deep isolation block comprises forming adjacent deep isolation blocks; and removing the exposed isolation block comprises forming the substrate island fin between the adjacent deep isolation blocks such that the gap is defined between the substrate island fin and each of the adjacent deep isolation blocks.

8. The method of claim 1 wherein:

forming the deep isolation block comprises forming adjacent deep isolation blocks; and forming the shallow isolation block comprises forming at least two shallow isolation blocks such that each of the two shallow isolation block is in direct contact with one of the adjacent deep isolation blocks such that the SOI substrate forms the short fin defined directly between the at least two shallow isolation blocks.

9. The method of claim 7 wherein forming the shallow isolation block comprises forming at least two shallow isolation blocks in direct contact with adjacent deep isolation blocks such that the SOI substrate forms the short fin defined directly between the at least two shallow isolation blocks.

10. The method of claim 1 further comprising:

forming a gate overlying the short fin.

11. The method of claim 10 further comprising:

forming the gate within the trough.

12. The method of claim 6 further comprising:

forming the gate within the trough.

* * * * *